United States Patent
Tabatowski-Bush et al.

(10) Patent No.: US 11,909,008 B2
(45) Date of Patent: Feb. 20, 2024

(54) BATTERY PACK WIRELESS ARRAY TRACKER

(71) Applicant: Ford Global Technologies, LLC, Dearborn, MI (US)

(72) Inventors: Benjamin A. Tabatowski-Bush, Ann Arbor, MI (US); Renata Michaela Arsenault, Plymouth, MI (US); Kent Snyder, Dearborn, MI (US); Brian Joseph Robert, Saint Clair Shores, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 285 days.

(21) Appl. No.: 17/334,112

(22) Filed: May 28, 2021

(65) Prior Publication Data
US 2022/0384862 A1    Dec. 1, 2022

(51) Int. Cl.
*H01M 10/42* (2006.01)
*H04Q 9/00* (2006.01)
*G01R 31/396* (2019.01)
*G01R 31/3835* (2019.01)

(52) U.S. Cl.
CPC .... *H01M 10/4257* (2013.01); *G01R 31/3835* (2019.01); *G01R 31/396* (2019.01); *H04Q 9/00* (2013.01); *H01M 2010/4271* (2013.01); *H01M 2220/20* (2013.01); *H04Q 2209/40* (2013.01)

(58) Field of Classification Search
CPC .......... G01R 19/16542; G01R 31/3835; G01R 31/396; H01M 10/425; H01M 10/4257; H01M 10/48; H01M 10/486; H01M 2010/4271; H01M 2220/20; H04Q 2209/40; H04Q 2209/43; H04Q 9/00; Y02T 10/70
See application file for complete search history.

(56) References Cited

U.S. PATENT DOCUMENTS

| | | | |
|---|---|---|---|
| 6,023,147 | A | 2/2000 | Cargin, Jr. et al. |
| 7,619,417 | B2 | 11/2009 | Klang |
| 8,399,115 | B2 | 3/2013 | Ellwanger |
| 8,564,242 | B2 | 10/2013 | Hansford et al. |
| 8,612,079 | B2 | 12/2013 | Tang et al. |
| 8,692,663 | B2 | 4/2014 | Fecher |
| 9,060,213 | B2 | 6/2015 | Jones |
| 9,840,161 | B2 | 12/2017 | Chikkannanavar et al. |
| 10,006,967 | B2 | 6/2018 | Ganesan et al. |
| 10,209,314 | B2 | 2/2019 | Garcia et al. |
| 10,598,734 | B2 | 3/2020 | Newman et al. |

(Continued)

FOREIGN PATENT DOCUMENTS

| | | | |
|---|---|---|---|
| CN | 104201735 A | | 12/2014 |
| EP | 2555311 B1 | | 2/2016 |

(Continued)

*Primary Examiner* — Victoria H Lynch
(74) *Attorney, Agent, or Firm* — David B. Kelley; Brooks Kushman P.C.

(57) ABSTRACT

A wireless cell array tracker includes a daisy chain connecter and processor each supported on a circuit substrate. The circuit substrate is attached to a battery array. The daisy chain connector physically interfaces with a battery sensing module of the battery array. The processor retrieves data from the battery sensing module via the daisy chain connector, and commands wireless transmission of the data.

19 Claims, 4 Drawing Sheets

(56) References Cited

U.S. PATENT DOCUMENTS

| | | | |
|---|---|---|---|
| 10,613,150 B2 | 4/2020 | Lih et al. | |
| 2007/0108946 A1 | 5/2007 | Yamauchi et al. | |
| 2015/0093611 A1 | 4/2015 | Obata | |
| 2020/0014075 A1* | 1/2020 | Tabatowski-Bush | ........................ H01M 10/425 |
| 2022/0120817 A1* | 4/2022 | Okada | ................ G01R 31/3842 |

FOREIGN PATENT DOCUMENTS

| | | |
|---|---|---|
| JP | 5733648 B2 | 6/2015 |
| WO | 2018077543 A1 | 5/2018 |
| WO | 2019028451 A1 | 2/2019 |

\* cited by examiner

BATTERY PACK WIRELESS ARRAY TRACKER

TECHNICAL FIELD

This disclosure relates to battery packs for automotive vehicles.

BACKGROUND

An electrified vehicle may include a battery pack arranged to provide power to drive the vehicle via an electric machine. The battery pack may be removed and replaced during the life of the electrified vehicle.

SUMMARY

A wireless cell array tracker for an automotive battery array includes a circuit substrate supporting a transceiver, a daisy chain connector, and a processor. The daisy chain connector physically interfaces with a battery sensing module of the battery array. The battery sensing module measures data of cells of the battery array via sensors, confirms correct operation of the sensors, and applies an ohmic load to the cells for balancing. The processor retrieves voltage data from the battery sensing module via the daisy chain connector, and transmits the voltage data via the transceiver.

A battery pack includes a cell array, a battery sensing module carried by the cell array, and a wireless array tracker carried by the cell array. The battery sensing module measures data of cells of the cell array via sensors and applies an ohmic load to the cells for balancing. The wireless cell array tracker includes a daisy chain connector that physically interfaces with the battery sensing module.

A wireless cell array tracker includes a daisy chain connecter and a processor each supported on a circuit substrate attached to a battery array. The daisy chain connector physically interfaces with a battery sensing module of the battery array. The processor retrieves data from the battery sensing module via the daisy chain connector, and commands wireless transmission of the data.

DETAILED DESCRIPTION

Figure 1:
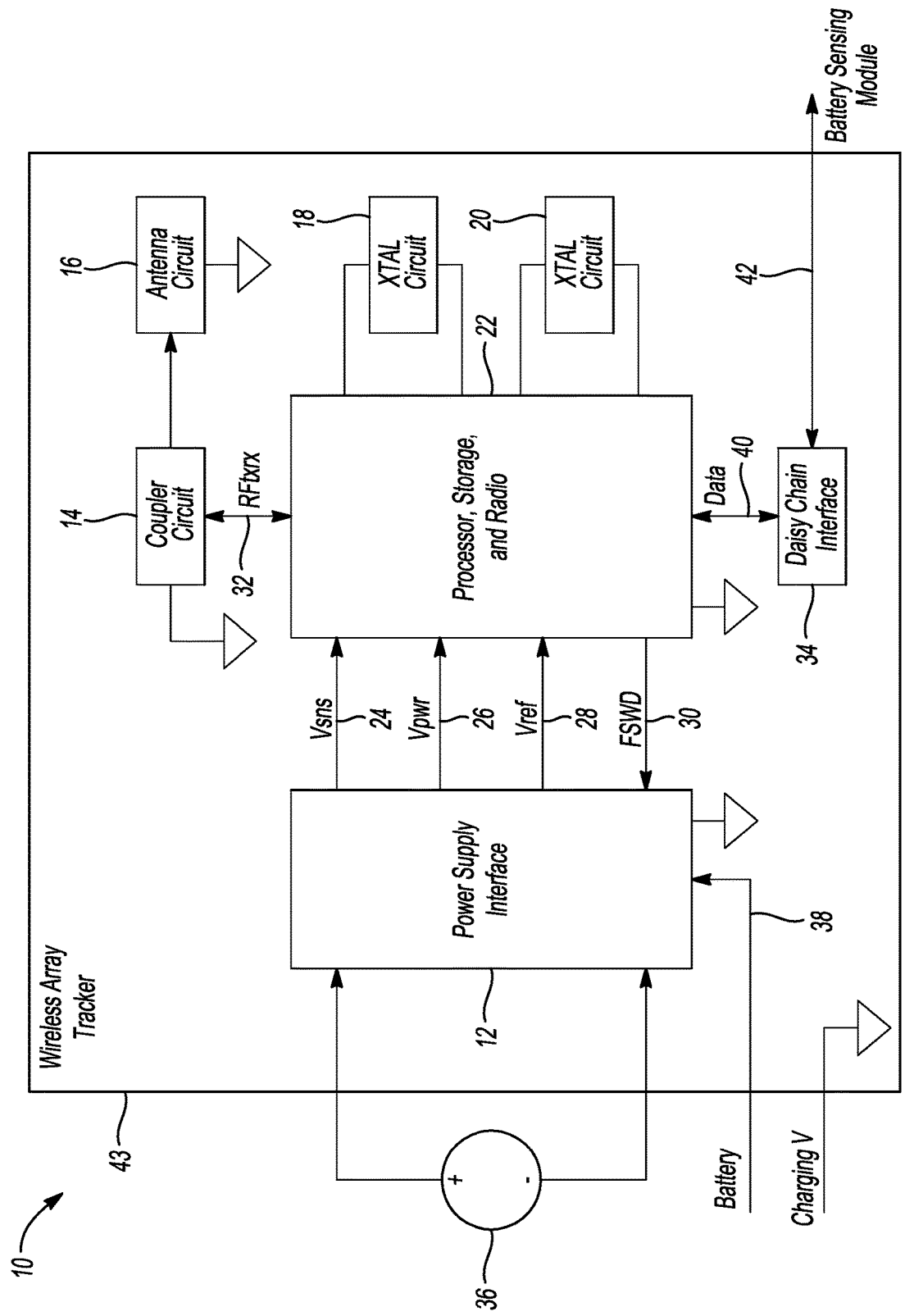
FIG. 1 is a schematic diagram of a wireless array tracker.

Embodiments are described herein. It is to be understood, however, that the disclosed embodiments are merely examples and other embodiments may take various and alternative forms. The figures are not necessarily to scale. Some features could be exaggerated or minimized to show details of particular components. Therefore, specific structural and functional details disclosed herein are not to be interpreted as limiting, but merely as a representative basis for teaching one skilled in the art.

As electrified vehicles enter the market in growing numbers, they introduce unique challenges related to the service requirements of the high voltage battery. Batteries are comprised of multiple parallel or series connected cell assemblies grouped into functional units: arrays or modules. As these modular building blocks become serviceable components, battery proliferation and the need to service within and beyond warranty introduces asset management challenges. The future may bring warehouses filled with arrays stored for potential redeployment into a variety of applications, such as warranty service/replacement, second life stationary storage, etc. If the state of health (SOH) of an array or module can be readily and reliably determined, this will make the asset more valuable to the owner for internal routing decisions, inventory management, and selling to third party integrators and after-market partners. Today, battery data being collected throughout vehicle life resides in multiple databases, serves different purposes, may be difficult to locate, and may have differing permanency/retention timeframes.

There is growing recognition of the importance of access to reliable battery SOH data to inform post vehicle decisions. A solution being implemented by some is inclusion of specific hardware (application specific integrated circuits, local storage, etc.) on the cell, module, or battery, intended primarily for post-vehicle information purposes but installed with the battery and present throughout the in-vehicle life phase. This hardware must therefore meet the robustness requirements of the vehicle environment, add cost, and will have some redundancy to data that is collected over the air.

Battery systems may employ sophisticated and costly control hardware configured in increasingly distributed architectures. Upon removal of an array from a vehicle, the associated controls or sensing modules are typically of value if and when the array is returned into vehicle service, but do not necessarily lend themselves to second life applications, as engineering required to develop the communications interface diminishes the economic attractiveness of battery reuse. With the concepts contemplated herein however, the useful life of the battery pack sensing module can be extended beyond removal from the vehicle and can provide new economic benefits and lower both the total recycling stream of the battery system and the related environmental impacts through integration with low-cost customized technology that provides battery health data beyond vehicle service.

Here, wireless communication, processing, and storage capabilities are proposed to be added to cell arrays (modular portions of an electrified vehicle's high voltage battery) to benefit second life applications and array asset management. At time of removal from the vehicle, battery control module data pertinent to battery cell SOH, voltage, and capacity may be retrieved, linked with cloud data, and selectively placed into nonvolatile storage in a new piece of electronics attached to the array, the second life wireless array tracker (SWAT). This stored or linked data may include SOH-related information collected over the life of the vehicle from a multiplicity of sources, such as the vehicle control system, cloud-based servers containing a repository of connected vehicle data, and external databases operated by third parties such as dealers and charge station operators. It may also include a wide variety of event based metadata, battery capacity evolution, charge history (categorized by power, duration, temperature, state of charge (SOC), etc.), usage, maintenance and diagnostic data collected directly or transmitted over the air during the usage period, and can include chemistry details helpful to recyclers that supplements information on the label. Each of these data sets serve a specific purpose and customer set, but the SWAT may link them into one array-referenced cloud 'address' providing a comprehensive history over the in-vehicle usage period.

The SWAT may be comprised of a radio interface for geolocation and networking within a single warehouse or global system of warehouses, a small processor for limited computational functions, and a power supply interface used for managing connection to the embedded battery and regulating charging thereof as needed. The independent embedded battery powers the SWAT electronics, and by monitoring its voltage, the processor may have the capability to notify the local network when the battery requires recharging. The SWAT may retain connection to key array instrumentation in the battery pack sensing module (located within the array) via a daisy chain interface, and thus continue to provide visibility into the evolving health and state of charge of the array by providing information such as open circuit voltages of the corresponding cells. It therefore may also be able to send network alerts if the array requires attention, maintenance, or recharging. The embedded controller may be configured to run at the desired clock frequency to support wake-up and other timing functions. By limiting the wake-up frequency of the device, it may require very low power (uW), but will thus keep the cloud-based data updated. A possible triangularization/geolocation feature may allow rapid, data-driven decisions on which assets are best suited for various needs (warranty replacement, backward compatible array replacements, second use, etc.) and their specific location.

The SWAT may also allow for direct local area access to array status and other information stored in its memory via a BLUETOOTH or similar-type short-range wireless connection when in local proximity to the array. This, for example, may be achieved using a hand-held device or smartphone, in locations or storage containers where connection to a larger area Wi-Fi network signal and/or geolocation signal may be temporarily or permanently unavailable, or for applications where only controlled, proprietary, local access is desired for security purposes. The SWAT may also include provisions for wired connection and access similar to the above, and for similar purposes to the above to allow usage of a portable and/or handheld access device that can be directly connected to the SWAT/array interface.

As the numbers of electric vehicles requiring servicing and arrays of various ages in storage grow, a rapid assessment of all available assets may become helpful to support service and redeployment needs. An added complication may be to 'match' the SOH and/or SOC of the pack with a closest available array in order to minimize SOH and/or SOC discrepancy balancing countermeasures required by the control system.

The SWAT may also benefit second life applications through a standardized application programming interface (API) that securely exposes access to real-time and stored data. Arrays equipped with such technology may offer a secure and user-friendly interface, and thus may be preferentially sought and valued higher by second life integrators than those where the battery health and usage history data is less rich, or where there is no 'plug and play' integration feature that will save significant cost and complexity in repurposing applications and support the Internet-of-Things ecosystem related to sustainable traction battery repurposing. Furthermore, the API may be used to extend selected features (limits, etc.) from battery primary service to enhance battery use beyond removal from the vehicle.

Protocols may delineate between internally facing data (enterprise inventory management) and curated data subsets available following transfer to potential third parties.

The SWAT may be used to store and make available (to authorized parties) additional information related to overall sustainability. This may include chemistry details that may be helpful to recyclers, which supplement the high-level information available on the battery label, or information relating to the provenance of battery constituents (ethically sourced or country of origin, for example). This is an example where a unique communication strategy may be employed exposing a curated subset of the available array data intended only for and available only to approved recyclers.

Generally speaking, a wireless array tracker may contain a radio interface for local networking and geolocation, as well as a processor for calculations, and built-in permanent storage. It may be powered by a storage battery and contain a daisy chain interface to a corresponding battery pack sensing module, which is contained inside the array. Referring to FIG. 1, wireless array tracker 10 is fastened to an array which is removed from an electrified vehicle. It includes a power supply interface 12, an antenna coupler circuit 14, an antenna circuit 16, a processor crystal 18, a timer crystal 20, and a block 22 with a processor, storage, and radio. Between the power supply interface 12 and block 22, the wireless array tracker 10 includes a Vsns signal line 24, a Vpwr signal line 26, a Vref signal line 28, and a FSWD switch control signal line 30. The block 22 interfaces with the antenna coupler circuit 14 and antenna circuit 16 via a bidirectional radio frequency transmit and receive path RFtrx 32. The processor crystal 18 is, for example, 24 Mhz and is chosen to allow the embedded controller to run at the desired clock frequency. The timer crystal 20 is, for example, a 32 kHz clock crystal and is chosen to create an accurate timing standard for wakeup timing and other timing purposes. The wireless array tracker 10 further includes daisy chain interface 34, optional battery 36, and charging voltage line 38, which when applied can recharge the battery 36 as needed. The daisy chain interface 34 contains components to interface a data interface 40 from the processor of the block 22 and interface 42 to a corresponding battery sensing module on the array. The components shown are supported by circuit substrate 43.

Figure 2:
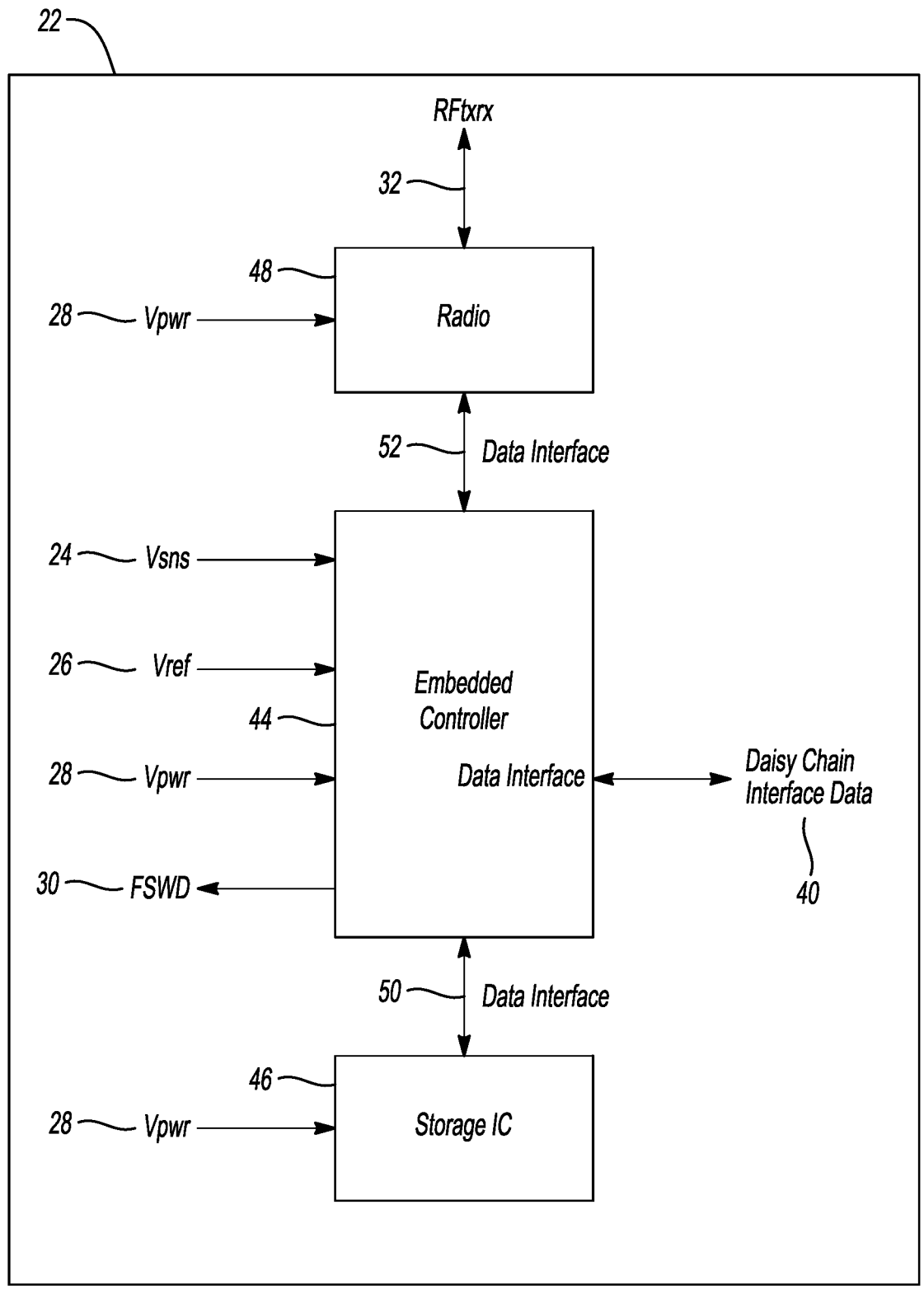
FIG. 2 is schematic diagram of a processor, storage, and radio of the wireless array tracker of FIG. 1.

Referring to FIG. 2, the block 22 includes an embedded controller 44 (a processor selected for low current consumption and low cost, but with adequate resources for the described functions), storage integrated circuitry 46, and radio 48. The embedded controller 44 reads the voltage of the battery 36 through the Vsns signal line 24, for purposes of notifying local networking when the battery 36 needs recharging. It has the Vref signal line 26 available for the analog to digital converter in the embedded controller 44, which is used to convert data from the Vsns signal line 24. The Vpwr signal line 28 is the power supply for the embedded controller 44, the storage integrated circuitry 46, and the radio 48. The storage integrated circuitry 46 is connected through a data interface 50, which can be any type of connection as needed. The storage integrated circuitry 46 is large enough to hold all the data storage as needed by the wireless array tracker applications. The radio 48 is also connected through a data interface 52, and interfaces to the antenna coupler circuit 14 and antenna circuit 16 through the bidirectional radio frequency transmit and receive path RFtxrx 32. The radio 48 can be any device that meets the requirements, such as an 802.15.4 radio or other Internet-of-Things radio, and act to transmit any data available to the wireless array tracker 10.

Figure 3:
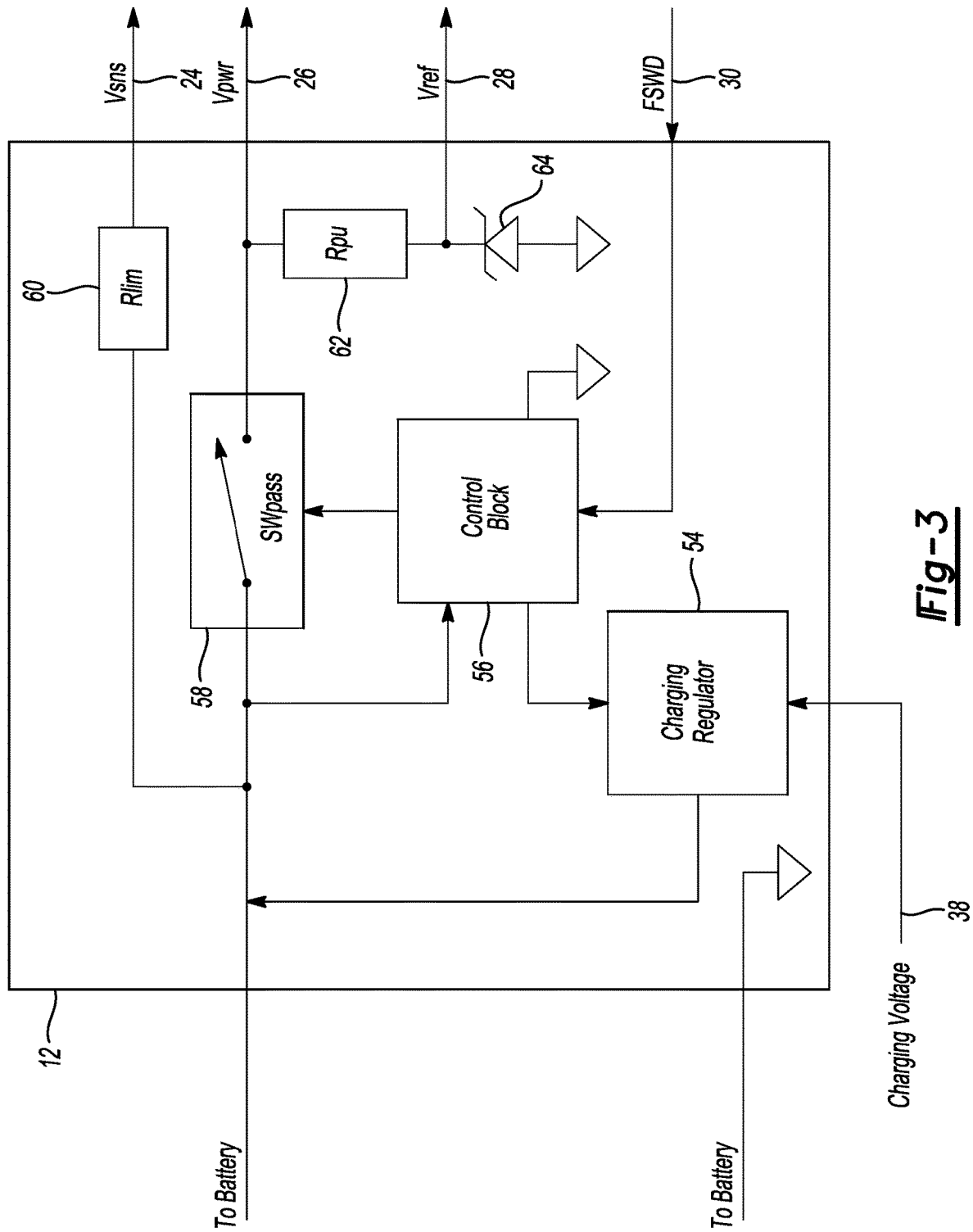
FIG. 3 is a schematic diagram of a power supply interface of the wireless array tracker of FIG. 1.

Referring to FIG. 3, the power supply interface 12 includes charging regulator 54, power supply control block 56, pass switch 58, limiting resistor Rlim 60, pull-up resistor Rpu 62, and reference integrated circuit 64. The power supply interface 12 provides a reading of the battery voltage Vsns 24, which can be reported by the embedded controller 44 via the radio 48 to the premises network. This power supply manages the connection to the battery 36, which provides power to all the wireless array tracker electronics. As mentioned previously, the battery 36 may eventually run out of power and need recharging, which it can do so through application of the charging voltage line 38, which may be any voltage adequate for charging the battery 36, regulated through the charging regulator 54, which is controlled by the power supply control block 56. This control block monitors the battery voltage through the Vsns 24 signal line and stops the charging as appropriate. The power supply control block 56, upon receipt of the command signal via the FSWD switch control signal line 30 from the embedded controller 44 can disconnect the battery 36 via pass switch 58, therefore resetting the embedded controller 44. The pull-up resistor Rpu 62 and reference integrated circuit 64 are used to produce the signal carried by the Vref signal line 28. The limiting resistor Rlim 60 limits leakage current from the battery 36 to the other electronic components.

Figure 4:
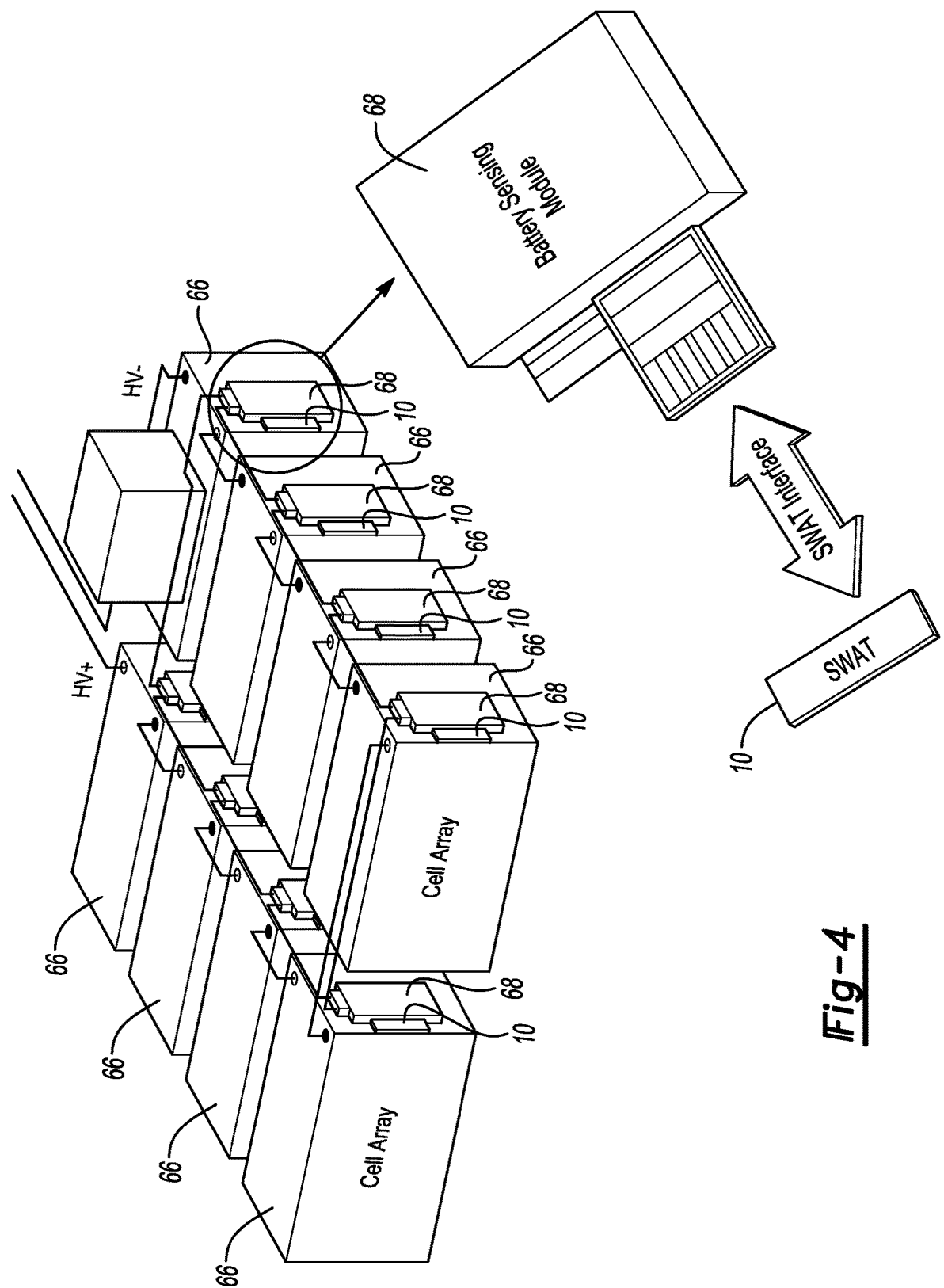
FIG. 4 is a perspective view of a battery pack.

Referring to FIG. 4, each of a plurality of cell arrays 66 has attached thereto a battery sensing module 68 and a corresponding wireless array tracker 10. The battery sensing modules 68, as known in the art, measure data of cells (e.g., voltage data, temperature data, timed data, etc.) of the cell arrays 66 via sensors, confirm correct operation of the sensors, and apply ohmic loads to the cells for balancing.

Each of the battery sensing modules 68 contains a battery monitoring integrated circuit (BMIC). Two typical features of a BMIC is to measure the cell voltages of batteries it is connected to via its Vin pin, and to measure the temperature of a thermistor connected to a thermistor input pin of the BMIC. The BMIC may be powered from the cells it is monitoring, or it could be powered by a separate, dedicated battery.

A BMIC typically has a data interface, called a daisy chain interface, that usually connects a set of such BMICs to each other in a serial string. To command a BMIC to provide a voltage or temperature of the cells that it is monitoring, a command is sent to the daisy chain input of the BMIC. It will respond back with the requested information. For example, if all cell voltage data that a BMIC is measuring is desired, a cell voltage conversion command is sent, which internally operates an analog to digital converter to put into registers digital words that represent the cell voltages. Another command is used to read out the numbers in the registers, which represent the cell voltages. A register can also be read that represents the value of the voltage on the thermistor input.

The wireless array tracker 10 communicates with the battery sensing module 68 via an interface. As such, the embedded controller 44 may retrieve data, such as the voltage data, temperature data, timed data, etc., from the battery sensing module 68, store such data in the storage integrated circuitry 46, and wirelessly transmit such data via the radio 48, coupler circuit 14, and antenna circuit 16.

For one of the wireless array trackers 10 to pull timed data from its corresponding battery sensing module 68, it internally is configured with a time period and a number of samples. After starting, every period duration it will make a reading from the battery sensing module of voltage or temperature, and then wait the same duration, and make a reading, and so on. This time series data may be stored in the wireless asset tracker 10 for later retrieval, or it may be transmitted to a server immediately.

The unique identifier for a BMIC of a corresponding one of the battery sensing modules 68 is available in a particular register in the BMIC. For the wireless asset tracker 10 to read it, it sends a command to the BMIC to read this register, and the BMIC will respond with its unique identifier.

The wireless asset tracker 10 may expose an API to a remote server as mentioned above. To do this, the wireless asset tracker 10 has a method of receiving a command through the networking interface, for example through an http: request. When it receives this request, it takes the correct actions to retrieve the underlying data from the corresponding BMIC that it is connected to. The data could be cell voltages or temperatures, or a time series as described above. Upon retrieving this data from the BMIC, the wireless asset tracker 10 relays back to the requester over the network interface the requested data.

The algorithms, methods, or processes disclosed herein can be deliverable to or implemented by a computer, controller, or processing device, which can include any dedicated electronic control unit or programmable electronic control unit. Similarly, the algorithms, methods, or processes can be stored as data and instructions executable by a computer or controller in many forms including, but not limited to, information permanently stored on non-writable storage media such as read only memory devices and information alterably stored on writeable storage media such as compact discs, random access memory devices, or other magnetic and optical media. The algorithms, methods, or processes can also be implemented in software executable objects. Alternatively, the algorithms, methods, or processes can be embodied in whole or in part using suitable hardware components, such as application specific integrated circuits, field-programmable gate arrays, state machines, or other hardware components or devices, or a combination of firmware, hardware, and software components.

While exemplary embodiments are described above, it is not intended that these embodiments describe all possible forms encompassed by the claims. The words used in the specification are words of description rather than limitation, and it is understood that various changes may be made without departing from the spirit and scope of the disclosure.

As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A wireless cell array tracker for an automotive battery array, comprising:
    a circuit substrate carrying
        a transceiver,
        a daisy chain connector configured to physically interface with a battery sensing module of the battery array, wherein the battery sensing module is configured to measure data of cells of the battery array via sensors, confirm correct operation of the sensors, and apply an ohmic load to the cells for balancing, and a processor programmed to retrieve voltage data from the battery sensing module via the daisy chain connector, and transmit the voltage data via the transceiver.

2. The wireless cell array tracker of claim 1, wherein the processor is further programmed to retrieve temperature data from the battery sensing module via the daisy chain connector.

3. The wireless cell array tracker of claim 1, wherein the processor is further programmed to retrieve timed data from the battery sensing module via the daisy chain connector.

4. The wireless cell array tracker of claim 1, wherein the processor is further programmed to store the voltage data.

5. The wireless array tracker of claim 1 further comprising an energy store configured to power the processor and transceiver, wherein the circuit substrate carries the energy store.

6. The wireless cell array tracker of claim 1, wherein the processor is further programmed to balance the cells via operation of the battery sensing module.

7. The wireless cell array tracker of claim 1, wherein the processor is further programmed to expose an application programming interface to a remote server.

8. The wireless cell array tracker of claim 1, wherein the processor is further programmed to retrieve a unique identifier from the battery sensing module, to store the unique identifier, and to transmit the unique identifier via the transceiver.

9. A battery pack comprising:
a cell array;
a battery sensing module carried by the cell array, and configured to measure data of cells of the cell array via sensors and to apply an ohmic load to the cells for balancing; and
a wireless cell array tracker carried by the cell array and including a daisy chain connector configured to physically interface with the battery sensing module.

10. The battery pack of claim 9, wherein the wireless cell array tracker further includes a processor programmed to retrieve voltage data from the battery sensing module via the daisy chain connector.

11. The battery pack of claim 9, wherein the wireless cell array tracker further includes a processor programmed to retrieve temperature data from the battery sensing module via the daisy chain connector.

12. The battery pack of claim 9, wherein the wireless cell array tracker further includes a processor programmed to retrieve timed data from the battery sensing module via the daisy chain connector.

13. The battery pack of claim 9, wherein the wireless cell array tracker further includes a processor programmed to store data retrieved from the battery sensing module.

14. The battery pack of claim 9, wherein the wireless cell array tracker further includes a transceiver.

15. The battery pack of claim 9, wherein the wireless cell array tracker further includes a processor programmed to expose an application programming interface to a remote server.

16. The battery pack of claim 9, wherein the wireless cell array tracker further includes a transceiver and a processor programmed to retrieve a unique identifier from the battery sensing module, to store the unique identifier, and to transmit the unique identifier via the transceiver.

17. A wireless cell array tracker comprising:
a daisy chain connecter supported on a circuit substrate attached to a battery array and configured to physically interface with a battery sensing module of the battery array; and
a processor supported on the circuit substrate and programmed to retrieve data from the battery sensing module via the daisy chain connector, and to command wireless transmission of the data.

18. The wireless cell array tracker of claim 17 further comprising a transceiver supported on the circuit substrate.

19. The wireless cell array tracker of claim 18, wherein the processor is further programmed to retrieve a unique identifier from the battery sensing module, to store the unique identifier, and to command transmission of the unique identifier.

* * * * *